United States Patent
Berker et al.

(10) Patent No.: US 9,903,960 B1
(45) Date of Patent: Feb. 27, 2018

(54) SCINTILLATION EVENT POSITION DETERMINATION IN A RADIATION PARTICLE DETECTOR

(71) Applicant: KONINKLIJKE PHILIPS N.V., Eindhoven (NL)

(72) Inventors: Yannick Berker, Witten (DE); Volkmar Schulz, Wuerselen (DE)

(73) Assignee: KONINKLIJKE PHILIPS N.V., Eindhoven (NL)

(*) Notice: Subject to any disclaimer, the term of this patent is extended or adjusted under 35 U.S.C. 154(b) by 0 days.

(21) Appl. No.: 15/128,117

(22) PCT Filed: Mar. 3, 2016

(86) PCT No.: PCT/EP2016/054485
§ 371 (c)(1),
(2) Date: Sep. 22, 2016

(87) PCT Pub. No.: WO2016/146391
PCT Pub. Date: Sep. 22, 2016

(30) Foreign Application Priority Data

Mar. 17, 2015 (EP) .................................. 15159419

(51) Int. Cl.
*G01T 1/20* (2006.01)
*G01T 1/29* (2006.01)
(Continued)

(52) U.S. Cl.
CPC .......... *G01T 1/2985* (2013.01); *G01R 33/481* (2013.01); *G01T 1/1603* (2013.01);
(Continued)

(58) Field of Classification Search
CPC ... G01T 1/2018; G01T 1/2985; G01T 1/1642; G01T 1/202; G01T 1/20; G01T 1/1647; A61B 6/037; G01N 2223/505
See application file for complete search history.

(56) References Cited

U.S. PATENT DOCUMENTS 5,747,812 A * 5/1998 DiFilippo ............. G01T 1/1642
250/363.1
8,446,308 B2 5/2013 Burr
(Continued)

FOREIGN PATENT DOCUMENTS

WO 2012095981 7/2012
WO 2014/180734 11/2014

OTHER PUBLICATIONS

Lerche, et al., "Maximum likelihood based positioning and energy correction for pixelated solid-state PET detectors" 2011 IEEE Nuclear Science Symposium and Medical Imaging Conference; Oct. 23, 2011.
(Continued)

*Primary Examiner* — Marcus Taningco

(57) ABSTRACT

A method for determining the position of a scintillation event in a radiation particle detector with multiple scintillator element locations which are configured to emit a burst of photons responsive to a radiation particle being absorbed at the scintillator element location and with a plurality of photosensors (5.1, 5.2, 5.3, 5.4) optically coupled to said scintillator element locations, comprising the steps of determining, for each of the photosensors (5.1, 5.2, 5.3, 5.4), a triggering probability indicative of the probability of said photosensor (5.1, 5.2, 5.3, 5.4) measuring a number of photons that exceeds a predetermined triggering threshold; measuring a photon distribution with the photosensors (5.1, 5.2, 5.3, 5.4) indicative of the number of photons incident on the individual photosensors (5.1, 5.2, 5.3, 5.4); calculating, for each of the scintillator element locations, a likelihood that a scintillation event with a predetermined energy value took place in said scintillator element location based on the measured photon distribution and the triggering probability of each of the photosensors (5.1, 5.2, 5.3, 5.4); and identifying the scintillator element location having the maximum likelihood.

14 Claims, 3 Drawing Sheets

(51) Int. Cl.
*G01T 1/164* (2006.01)
*G01T 1/24* (2006.01)
*G01R 33/48* (2006.01)
*G01T 1/16* (2006.01)

(52) U.S. Cl.
CPC .......... *G01T 1/1642* (2013.01); *G01T 1/1647* (2013.01); *G01T 1/20* (2013.01); *G01T 1/243* (2013.01)

(56) References Cited

U.S. PATENT DOCUMENTS

| | | | |
|---|---|---|---|
| 9,753,146 B2* | 9/2017 | Lerche | G01T 1/1647 |
| 9,835,740 B2* | 12/2017 | An | G01T 1/2985 |
| 2009/0309648 A1* | 12/2009 | Zheng | G01J 1/42 327/514 |
| 2010/0044571 A1 | 2/2010 | Miyaoka | |
| 2014/0264041 A1 | 9/2014 | Schulz | |
| 2016/0084974 A1* | 3/2016 | Lerche | G01T 1/1642 250/362 |
| 2016/0187497 A1* | 6/2016 | Lerche | G01T 1/1647 250/362 |

OTHER PUBLICATIONS

Tabacchini, et al., "Probabilities of triggering and validation in a digital silicon photomultiplier", Journal of Instrumentation, Institute of Physics Publishing, vol. 9, No. 6, Jun. 18, 2014.
Hesterman, et al., "Maximum-Likelihood Estimation With a Contracting-Grid Search Algorithm", IEEE Transactions on Nuclear Science, vol. 57, No. 3, Jun. 2010.

* cited by examiner

US 9,903,960 B1

SCINTILLATION EVENT POSITION DETERMINATION IN A RADIATION PARTICLE DETECTOR

CROSS REFERENCE TO RELATED APPLICATIONS

This application is the U.S. National Phase application under 35 U.S.C. § 371 of International Application No. PCT/EP2016/054485, filed Mar. 3, 2016, published as WO 2016/146391 on Sep. 22, 2016, which claims the benefit of European Patent Application Number 15159419.9 filed Mar. 17, 2015. These applications are hereby incorporated by reference herein.

FIELD OF THE INVENTION

The present invention relates to the field of radiation particle detectors. It finds particular application in nuclear imaging systems such as, for example positron emission tomography (PET) scanners for clinical or research studies as well as single photon emission computed tomography (SPECT) scanners.

BACKGROUND OF THE INVENTION

In PET scanners pixellated scintillator elements are typically used to convert incident radiation particles to bursts of photons with a wavelength in the UV or visible spectrum. The scintillator elements are typically arranged in a matrix wherein each scintillator element has a base area in the order of $1 \times 1$ mm$^2$ to $4 \times 4$ mm$^2$. The scintillation events are detected by photosensors coupled to the scintillator elements. State of the art PET scanners use solid-state photosensors, e.g. silicon photomultipliers (SiPMs), typically comprising an array of single photon avalanche diodes (SPADs) being configured to break down responsive to impingement of a photon.

Alternatively, monolithic scintillator elements may be used which consist of a large block of scintillator material. Monolithic scintillators are typically coupled to an array of photosensors configured to localize scintillation events at different scintillator element locations within the monolithic scintillator element.

The size of the scintillator element location that can be identified is a primary factor determining the spatial resolution of the resulting image. Thus, small scintillator element locations are desired to increase the resolution. In the quest for higher resolution solid-state nuclear imaging systems, Anger logic has been used to attain a resolution which is superior to the size of a single photosensor. By coupling the scintillator and the photosensors with a light guide that spreads the emitted scintillation light onto several photosensors and identifying the scintillator element locations with Anger logic, resolution can be improved. Since Anger logic relies on information from neighboring photosensors to identify the scintillator element location, Anger logic becomes inaccurate when information of some of the photosensors is missing, e.g. due to the scintillation event happening during a dead time period of a photosensor or due to individual photosensors being inactive for other reasons.

In order to improve robustness against missing photosensor information, maximum-likelihood methods have been introduced for localizing scintillation events and estimating the energy of those events. Maximum likelihood methods typically include calculating a likelihood for each possible scintillation event location, thereby estimating the energy of the scintillation event. Usually, the location that returns the highest likelihood is assumed to be the originating location of the event. Those maximum-likelihood methods show improved performance compared to Anger logic when measurement information of a single photosensor is missing. However, known maximum-likelihood methods fail if information of multiple photosensors is missing resulting in deteriorated scintillation event localization.

A document "Maximum likelihood based positioning and energy correction for pixellated solid-state PET detectors" by Christoph W. Lerche et al, 2011 IEEE Nuclear Science Symposium and Medical Imaging Conference, Valencia, Spain, 23-29 Oct. 2011, IEEE, Pitscataway, N.J., pp 3610-3613 discloses a detector for gamma-ray detection in the context of a preclinical MR-compatible PET scanner. The detector includes a LYSO crystal array and an array of silicon photomutipliers, together with an intermediate light guide that uses the light sharing principle. A positioning scheme that is based on maximising the likelihood of the scintillation events is disclosed. The method directly gives the index of the active crystal pixel and allows to correct the registered gamma ray energy.

SUMMARY OF THE INVENTION

It would be advantageous to improve the identification of scintillator element locations even when measurements from some of the photosensors are missing. To better address this concern, in a first aspect of the invention a method is presented for identifying the position of a scintillation event in a radiation particle detector with multiple scintillator element locations which are configured to emit a burst of photons responsive to a radiation particle being absorbed at the scintillator element location and with a plurality of photosensors optically coupled to said scintillator element locations, comprising the steps of:

determining, for each of the photosensors, a triggering probability indicative of the probability of said photosensor measuring a number of photons that exceeds a predetermined triggering threshold, measuring a photon distribution with the photosensors indicative of the number of photons incident on the individual photosensors, calculating, for each of the scintillator element locations, a likelihood that a scintillation event with a predetermined energy value took place in said scintillator element location based on the measured photon distribution and the triggering probability of each of the photosensors; and identifying the scintillator element location having the maximum likelihood.

According to another aspect of the invention a computer program product for performing the above-mentioned method is presented, comprising at least instructions configured to perform the steps of determining, for each of the photosensors, a triggering probability indicative of the probability of said photosensor measuring a number of photons that exceeds a predetermined triggering threshold, acquiring a photon distribution from the photosensors indicative of the number of photons incident on the individual photosensors, calculating, for each of the scintillator element locations, a likelihood that a scintillation event with a predetermined energy value took place in said scintillator element location based on the measured photon distribution and the triggering probability of each of the photosensors; and identifying the scintillator element location having the maximum likelihood.

According to yet another aspect of the invention a radiation particle detector is presented, comprising:

multiple scintillator element locations which are configured to emit a burst of photons responsive to a radiation particle being absorbed at the scintillator element location, a plurality of photosensors optically coupled to said scintillator element locations, and a processor configured to perform the steps of determining, for each of the photosensors, a triggering probability indicative of the probability of said photosensor measuring a number of photons that exceeds a predetermined triggering threshold, acquiring a photon distribution from the photosensors indicative of the number of photons incident on the individual photosensors, calculating, for each of the scintillator element locations, a likelihood that a scintillation event with a predetermined energy value took place in said scintillator element location based on the measured photon distribution and the triggering probability of each of the photosensors; and identifying the scintillator element location having the maximum likelihood.

Yet another aspect of the invention relates to a nuclear imaging system, comprising:

at least one radiation particle detector as described above, a reconstruction unit for reconstructing an image representation based on identified scintillator element locations, and a display for displaying at least a portion of the reconstructed image representation.

According to the present invention, for each of the photosensors, a triggering probability is determined which indicates the probability of said photosensor measuring an amount of light, i.e. a number of photons, that exceeds a predetermined threshold. Photosensors may have a triggering threshold in order to distinguish between measurements that result from scintillation events and measurements that result from dark noise. Typically, the photosensor outputs measurement data when the number of detected photons exceeds the predetermined triggering threshold. The distribution of light on the photosensors is measured. For each of the scintillator element locations a likelihood that a scintillation event with a predetermined energy took place in said scintillator element location is calculated based on the measured light distribution. When calculating the likelihood of an individual scintillator element location the triggering probability of each of the photosensors is additionally taken into account. By calculating the likelihood based on the triggering probability, measured information from photosensors having a relatively low probability of triggering (e.g. due to being deactivated or having a large dead time) is given less importance when calculating the likelihood. Photosensors that show a relatively high probability of triggering are given higher weight when calculating the likelihood. It has been found that the inventive method improves the localization of the scintillation event even when information from some of the photosensors is missing.

According to the invention a scintillator element location may be a location in a monolithic scintillator. Alternatively, a scintillator element location may be a scintillator element in a pixellated scintillator that comprises an array of scintillator elements. The scintillator element of the pixellated scintillator may be optically isolated from neighboring scintillator elements of the pixellated scintillator.

The invention is preferably applied to radiation particle detectors that comprise a light guide for guiding and/or spreading the light of the scintillator element location onto the photosensors. Nevertheless, the invention can be applied to radiation particle detectors that do not comprise a light guide as well.

Preferably, the photosensors comprise a silicon photomultiplier (SiPM). Silicon photomultipliers integrate an array of single photon avalanche diodes on a common silicon substrate. Readout electronics may be connected to the SiPM in order to acquire measurement data from the SiPM. In particular, the photosensor may comprise a digital SiPM which integrates readout circuits together with the SPADs on a common silicon substrate. When triggering, the SiPM preferably outputs a measurement signal which is proportional to the amount of photons detected by the SiPM.

According to a preferred embodiment of the invention, the method further comprises:

determining, for each of the scintillator element locations, a reference photon distribution, indicative of a reference number of photons incident on each of the photosensors when a scintillation event took place in said scintillator element location, and calculating the likelihood additionally based on the reference light distributions.

Preferably, the reference photon distribution and/or the triggering probability for each of the photosensors is determined based on measurements acquired during a calibration procedure. The calibration measurement may be carried out in advance of detecting radiation with the radiation detector. Advantageously, the calibration measurement is carried out at low scintillation event rates in order to reduce dead time of the photosensors as much as possible.

According to another preferred embodiment of the present invention, the step of determining the triggering probability of one of the photosensors includes determining, in particular measuring, a mean triggering probability of said photosensor. Determining a mean triggering probability and using this mean probability to calculate the likelihood for each of the scintillator element locations allows an improvement of scintillation event localization performance with reduced effort. It is merely required to store a single constant probability value for each of the photosensors. For example, the triggering probability of a photosensor that is not functional can be set to zero, whereas the triggering probability of a functional photosensor can be set to a constant value greater than zero.

According to another preferred embodiment of the present invention, the step of determining the triggering probability of one of the photosensors includes determining a dependence of the triggering probability on the number of photons incident on said photosensor. Thus, it is possible to calculate the likelihood of each of the scintillator element locations based on a triggering probability that is a function of the number of incident photons, thereby further improving localization performance.

Advantageously, the step of determining the triggering probability of a photosensor includes determining, in particular measuring, a first triggering probability of said photosensor for a number of photons incident on the photosensor which is below a predetermined triggering threshold and determining, in particular measuring, a second triggering probability of said photosensor for a number of photons incident on the photosensor which is equal to or above the triggering threshold, thereby allowing to use a simple step function model of the triggering probability for calculating the likelihoods.

According to another preferred embodiment of the present invention, the step of determining the triggering probability includes determining, in particular measuring, a temperature dependence of the triggering probability and the likelihoods are additionally calculated based on a measured temperature. Thus, when calculating the likelihoods, the temperature dependence of the triggering probability can be taken into account, thereby further improving the scintillation event localization.

It is further preferred that the step of determining the triggering probability includes determining, in particular measuring, a dependence of the triggering probability on the scintillation event rate and that the likelihoods are additionally calculated based on a measured scintillation event rate. As a consequence, the dependence of the triggering probability on the scintillation event rate can be accounted for when calculating the likelihoods, so as scintillation event localization is further improved. The scintillation event rate can be a mean event rate or an actual event rate.

According to yet another preferred embodiment of the invention, the step of determining the triggering probability includes determining, in particular measuring, a dependence of the triggering probability on the number of neighboring photosensors that triggered and the likelihoods are additionally calculated based on a measured number of neighboring photosensors that triggered.

Advantageously, the steps of calculating the likelihood for each of the scintillator element locations and determining the maximum likelihood are iteratively repeated with a modified energy value for each of the iterations. Thus, the location as well as the energy of the scintillation event can be iteratively estimated.

According to a preferred embodiment of the invention the nuclear imaging system comprises a plurality of radiation particle detectors disposed about an imaging region, wherein the reconstruction unit is configured to perform a positron emission tomography reconstruction technique. Exemplarily the radiation detectors may be disposed radially about an imaging region, or in the form of panels positioned around an imaging region, or for example in a ring surrounding an imaging region.

These and other aspects of the invention will be apparent from and elucidated with reference to the embodiments described hereinafter.

DETAILED DESCRIPTION OF EMBODIMENTS

Figure 1:
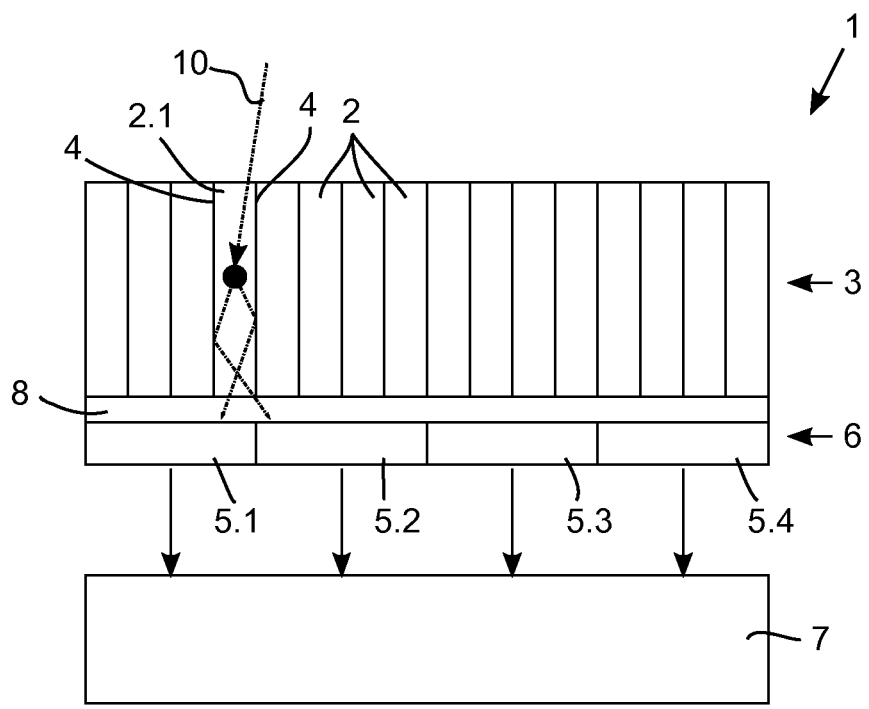
FIG. 1 is a side view of a radiation particle detector in accordance with a first embodiment of the invention.

FIG. 1 illustrates a first embodiment of a radiation particle detector 1 employed in a nuclear imaging system, e.g. a high-resolution PET scanner. The radiation particle detector 1 comprises a pixellated scintillator with a plurality of scintillator element locations, wherein the scintillator element locations are scintillator elements 2. The material of the scintillator elements 2 is selected to provide a high stopping power for 511 keV gamma rays with rapid temporal decay of the scintillation burst. Some suitable scintillator materials are lutetium oxyorthosilicate (LSO), lutetium yttrium orthosilicate (LYSO) and lanthanum bromide (LaBr). It should be appreciated that scintillator elements 2 made of other materials can be used instead. The structure of the scintillator material may for example be crystalline, polycrystalline, or ceramic. The scintillator elements 2 are arranged in a scintillator layer 3. In order to avoid light sharing between the scintillator elements 2 a reflector material 4, e.g. a reflective foil, is disposed between neighboring scintillation elements 2. Alternatively, the scintillator elements 2 can be encased in a reflective coating.

The scintillation elements 2 are coupled to a sensor layer 6, which is composed of an array of solid-state photosensors 5.1, 5.2, 5.3, 5.4. A planar light guide is interposed between the scintillator layer 3 and the photosensor layer 6 to allow the scintillation light to be spread onto several photosensors 5.1, 5.2, 5.3, 5.4. The photosensors 5.1, 5.2, 5.3, 5.4 are silicon photomultipliers (SiPMs) each comprising an array of single photon avalanche diodes monolithically disposed on a silicon substrate. The photosensor 5.1, 5.2, 5.3, 5.4 according to this embodiment is a so called digital silicon photomultiplier, which integrates readout circuits together with the single photon avalanche diodes on the same silicon substrate. The single photon avalanche detectors are configured to break down responsive to impingement of a photon. Inside the digital silicon photomultiplier a digital representation of the status of each of the single photon avalanche diodes of the array is available. State of the art digital SiPMs use the digital representation of the breakdown status of all diodes to calculate the sum of all single photon avalanche diodes in breakdown and output the calculated value together with a digital time stamp. If the sum of all single photon diodes in break down exceeds a predetermined triggering threshold, the energy and time stamp value is put out at an output of the photosensor 5.1, 5.2, 5.3, 5.4.

The radiation particle detector 1 further comprises a localization unit 7. The localization unit 7 comprises a processor that is configured to identify the position of a scintillation event on a per scintillator element basis. Responsive to the detection of a burst of photons by at least one of the photosensors 5.1, 5.2, 5.3, 5.4, the localization unit 7 determines the scintillator element 2 that emitted the burst of photons. The localization unit 7 according to the first embodiment is implemented as a separate unit connected to a plurality of photosensors 5.1, 5.2, 5.3, 5.4. Alternatively, the localization unit 7 can be implemented on the same substrate together with the single photon avalanche diodes and the readout electronics, e.g. as part of one photosensor 5.1, 5.2, 5.3, 5.4 or as a module comprising a plurality of photosensors 5.1, 5.2, 5.3, 5.4 and the localization unit 7.

FIG. 1 depicts a gamma ray 10 interacting with a scintillator element 2.1. As a result, a burst of photons with a wavelength in the UV or visible part of the spectrum is emitted by the scintillator element 2.1. The photons are reflected by the reflector 4 and escape the scintillator element 2.1 on the side of the scintillator element 2.1 that is coupled to the photosensor 5.1 via the light guide 8. The light escaping the scintillator element 2.1 at the side adjoining the light guide 8 is spread onto several photosensors 5.2 due to the light guide 8. Thus, photons are received by a first photosensor 5.1 as well as by a second photosensor 5.2

Figure 4:
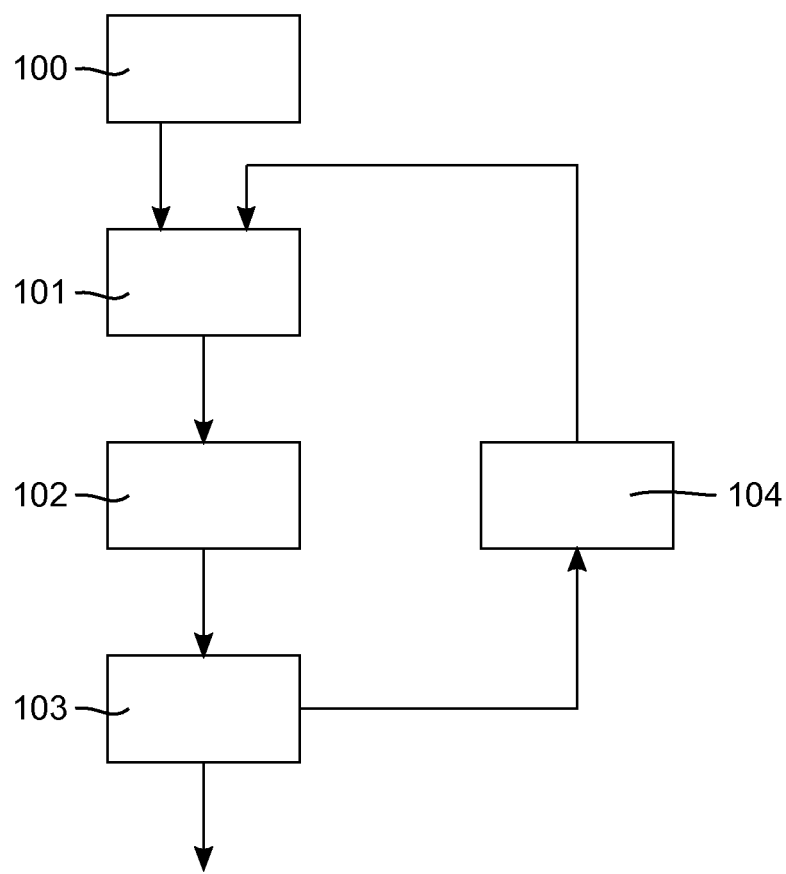
FIG. 4 is a flow diagram corresponding to a method in accordance with an embodiment of the invention.

The localization unit 7 includes a processor which is configured to perform the steps 100, 101, 102, 103 and 104 described in the following with further reference to FIGS. 1 and 4. In a calibration step 100 a reference photon distribution for each of the scintillator element locations 2 is determined. As an example, for the scintillator element location corresponding to the above-mentioned scintillator element 2.1, the reference photon distribution indicates a reference number of photons incident on each of the photosensors 5.1, 5.2, 5.3, 5.4 when a scintillation event took place in said scintillator element location 2.1. In the following, the mean fraction of scintillation light—corresponding to the number of photons—that will be detected at the photosensor with index j when the scintillation took place in the scintillator element with index i is denoted as $c_{i,j}$.

The calibration measurement step 100 is carried out at low scintillation event rates in order to reduce the dead time of the photosensors 5.1, 5.2, 5.3, 5.4 as much as possible. Furthermore, data used for calibration is limited to those scintillation events that are completely detected by the photosensors 5.1, 5.2, 5.3, 5.4 of the radiation particle detector 1. In other words, data is limited to those scintillation events for which the total energy detected by the photosensors 5.1, 5.2, 5.3, 5.4 is close to the energy value of the gammy rays. Localization of the scintillation events during the calibration step is done using Anger logic which works well for scintillation events that do not miss information.

Furthermore, in the calibration step 100, the determined calibration data is used to determine, for each of the photosensors 5.1, 5.2, 5.3, 5.4, a triggering probability indicative of the probability of said photosensor 5.1, 5.2, 5.3, 5.4 measuring a number of photons that exceeds a predetermined triggering threshold. The triggering threshold can e.g. be set to a number of photons selected from the set of rational numbers, e.g. 1, 2, 2.3, 3.3 or 8.2 photons. The triggering probability determined can either be a constant or a function one or several of the following parameters: The number of photons incident on said photosensor 5.1, 5.2, 5.3, 5.4, the temperature, the scintillation event rate and the number of neighboring pixels that triggered. Hereinafter, the triggering probability will be denoted as $P_j^T(c_{i,j} \cdot E)$, wherein j is the index of the photosensor, i is the index of the scintillator element and E is the estimated energy value deposited by the scintillation event.

In a likelihood calculation step 101, a photon distribution is acquired from the plurality of photosensors 5.1, 5.2, 5.3, 5.4. Each of the photosensors 5.1, 5.2, 5.3, 5.4 that triggered provides data indicative of the number of photons incident on said photosensor 5.1, 5.2, 5.3, 5.4. Moreover, for each of the scintillator elements 2, a likelihood is calculated that a scintillation event with a predetermined energy value took place in said scintillator element 2. The calculation is based on the measured photon distribution, the reference photon distribution determined in the calibration step 100 as well as the triggering probability determined in the calibration step 100. The likelihood for the case that a gamma particle deposits the energy E in scintillator element i given that the measured photon distribution was q={$q_j$} can be expressed as $$\prod_j \frac{(c_{i,j} \cdot E)^{q_j} \cdot \exp(-c_{i,j} \cdot E)}{q_j!} \cdot P_j^T(c_{i,j} \cdot E)$$

The likelihood is preferably calculated as the logarithm of a likelihood function—a so called log-likelihood. Using log-likelihoods facilitates data processing due to reduced computational effort. The corresponding log-likelihood is defined as $$L_i(i,E|q) = \Sigma_j q_i \log(c_{i,j} \cdot E) - c_{i,j} \cdot E - \log(q_j!) + \log P_j^T(c_{i,j} \cdot E)$$

After having calculated the likelihoods of each of the scintillator elements 2, in a maximizing step 102, the scintillator element 2 having the maximum likelihood is identified. This is the scintillator element 2 that is assumed to be the origin of the photon burst detected by the photosensors 5.2, 5.2, 5.3, 5.4.

The likelihood calculation step 101 and the maximizing step 102 can be carried out in an iterative fashion. Thus, after completing the maximizing step 102, in a stopping criterion step 103, the processor determines if a stopping criterion is met. The stopping criterion can e.g. be a predefined number of iterations or a given minimum energy value. In case the stopping criterion is met, the method is terminated and the scintillator element determined in maximizing step 102 is output for further processing, e.g. in a reconstruction unit 11 of a PET scanner together with the estimated energy value. If the stopping criterion is not met, an energy modification step 104 is carried out, that modifies the energy value used in the likelihood calculations step 101 to calculate the likelihoods of each of the scintillator elements 2. If $E^{(n)}$ is the estimated energy value after n iterations, the energy is set to be $$E^{(n+1)} = \frac{\sum_j q_j}{\sum_j c_{i(n),j}}$$

Figure 2:
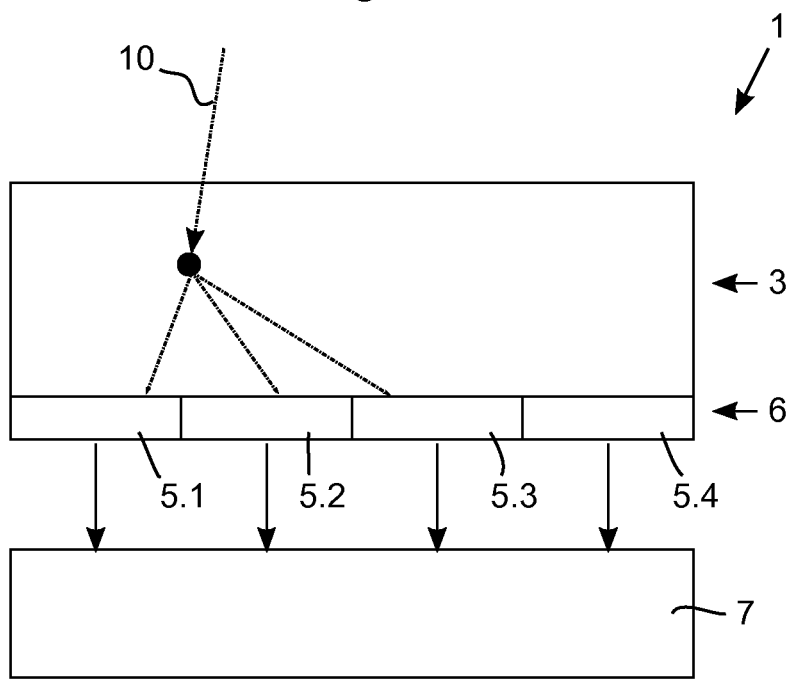
FIG. 2 is a side view of a radiation particle detector in accordance with a second embodiment of the invention.

FIG. 2 depicts a second embodiment of a radiation particle detector 1 according to the invention. The radiation particle detector 1 depicted in FIG. 2 comprises a scintillator layer 3 adjoining the photosensor layer 6. The scintillator layer 3 of the second embodiment is a monolithic scintillator consisting of block of scintillator material. Compared to the first embodiment, scintillator element locations in the monolithic scintillator are identified instead of scintillator elements of a pixellated scintillator. For the purpose of the inventive method, the monolithic scintillator can be assumed to have a plurality of scintillator element locations with a constant pitch.

The radiation particle detector according to the second embodiment does not comprise a light guide. Nevertheless, a light guide can optionally be disposed between the scintillator layer 3 and the photosensor layer 6 to further enhance light spreading onto the photosensors 5.1, 5.2, 5.3, 5.4.

FIG. 2 illustrates an interaction of gammy ray 10 with the monolithic scintillator 2 of the scintillator layer 3. Gamma ray 10 is stopped at a scintillator element location and the resulting burst of photons is spread over three neighboring photosensors 5.1, 5.2, 5.3.

The position as well as the energy of a scintillation event in the radiation particle detector according to the second embodiment may be determined as described with reference to the first embodiment.

Figure 3:
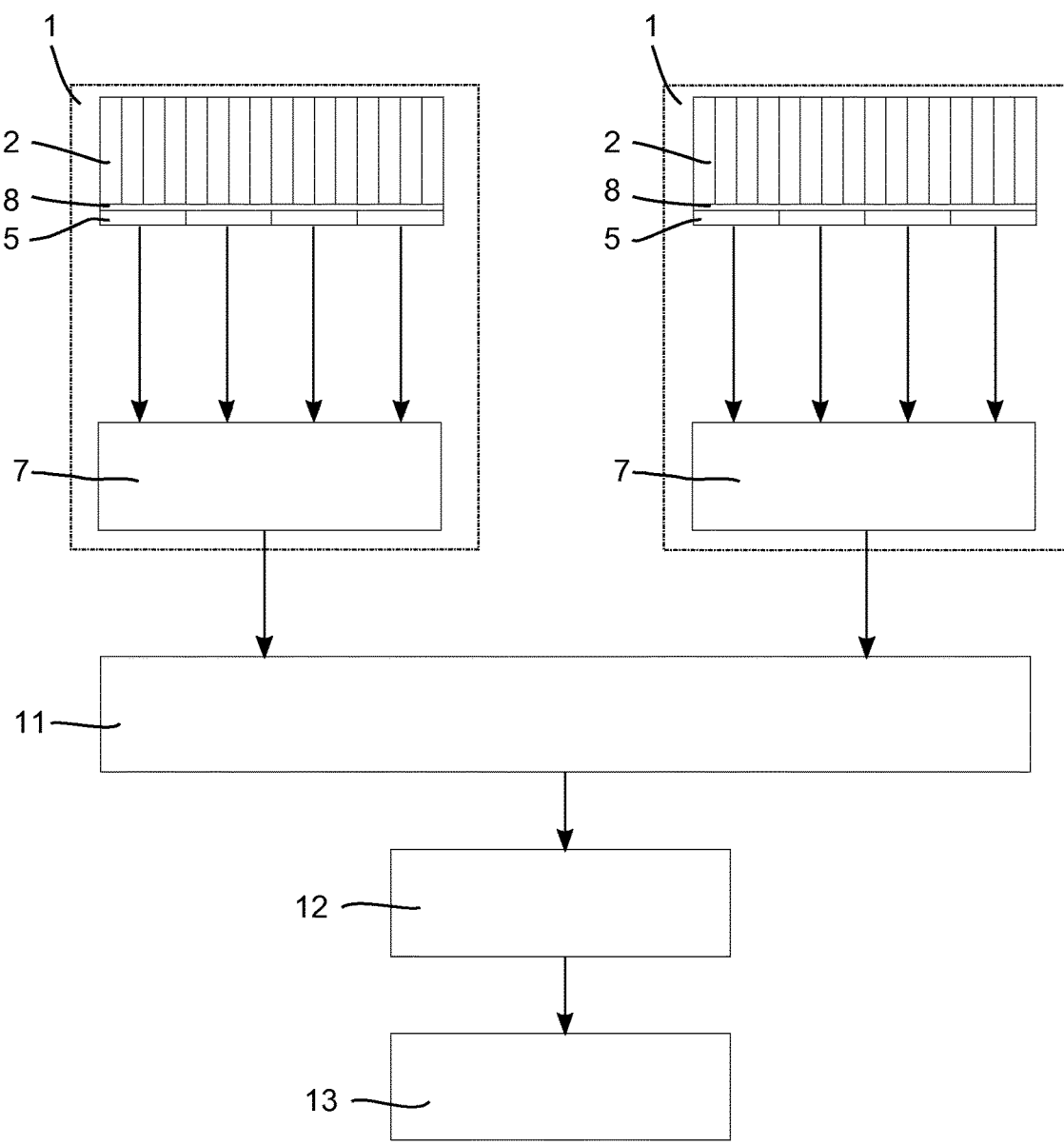
FIG. 3 is a diagrammatic illustration of a nuclear imaging system in accordance with an embodiment of the invention.

FIG. 3 is a diagrammatic illustration of a nuclear imaging system configured as a PET scanner including a plurality of radiation particle detectors 1. The radiation particle detectors 1 are arranged in one or more rings along an axial direction; however other arrangements of radiation particle detectors 1 may be used. The radiation particle detectors 1 surround an examination region. A subject positioned in the examination region has received a radiopharmaceutical which emits gamma rays or other radiation particles of characteristic energy that are detected by the radiation particle detectors 1.

The nuclear imaging system further comprises a reconstruction unit 11 that is configured to perform a positron emission tomography reconstruction technique. The reconstruction unit is connected to a plurality of radiation particle detectors 1 and receives scintillator element identification data. The reconstruction unit 11 reconstructs the scintillator element identification data of the radiation particle detectors 1 into an image representation which is stored in a memory 12. A display 13 is connected to the memory 12 for displaying at least a portion of the reconstructed image representation.

While the invention has been illustrated and described in detail in the drawings and foregoing description, such illustration and description are to be considered illustrative or exemplary and not restrictive; the invention is not limited to the disclosed embodiments. For example, it is possible to operate the invention in an embodiment wherein the nuclear imaging system is a SPECT scanner. According to another alternative embodiment of the invention the localization unit 7 is provided as a processor configured to carry out a computer program product, wherein the computer program product at least comprises instructions configured to perform the steps of determining, for each of the photosensors 5.1, 5.2, 5.3, 5.4, a triggering probability indicative of the probability of said photosensor 5.1, 5.2, 5.3, 5.4 measuring a number of photons that exceeds a predetermined triggering threshold, acquiring a photon distribution from the photosensors 5.1, 5.2, 5.3, 5.4 indicative of the number of photons incident on the individual photosensors 5.1, 5.2, 5.3, 5.4, calculating, for each of the scintillator element locations, a likelihood that a scintillation event with a predetermined energy value took place in said scintillator element location based on the measured photon distribution and the triggering probability of each of the photosensors 5.1, 5.2, 5.3, 5.4; and identifying the scintillator element location having the maximum likelihood. The computer program product may be stored and/or distributed on a suitable medium, such as an optical storage medium or a solid-state medium supplied together with or as part of other hardware, but may also be distributed in other forms, such as via the Internet or other wired or wireless telecommunication systems.

Other variation to the disclosed embodiments can be understood and effected by those skilled in the art in practicing the claimed invention, from study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Furthermore, the terms first, second, third and the like in the description are used for distinguishing between similar elements and not necessarily for describing a sequential or chronological order. Any reference signs in the claims should not be construed as limiting the scope.

The invention claimed is:

1. A method for determining the position of a scintillation event in a radiation particle detector having multiple scintillator element locations which are configured to emit a burst of photons responsive to a radiation particle being absorbed at the scintillator element location and having a plurality of photosensors optically coupled to said scintillator element locations, the method comprising the steps of:
   determining, for each of the photosensors, a triggering probability indicative of the probability of said photosensor measuring a number of photons that exceeds a predetermined triggering threshold,
   measuring, with the photosensors, a photon distribution indicative of the number of photons incident on the individual photosensors,
   calculating, for each of the scintillator element locations, a likelihood that a scintillation event with a predetermined energy value took place in said scintillator element location based on the measured photon distribution and the triggering probability of each of the photosensors; and
   identifying the scintillator element location having the maximum likelihood.

2. The method according to claim 1, wherein the method further comprises the steps of:
   determining, for each of the scintillator element locations, a reference photon distribution, indicative of a reference number of photons incident on each of the photosensors when a scintillation event took place in said scintillator element location, and
   calculating the likelihood based further on the reference photon distributions.

3. The method according to claim 1, wherein the reference photon distribution and/or the triggering probability for each of the photosensors is determined based on measurements acquired during a calibration procedure.

4. The method according to claim 1, wherein the step of determining the triggering probability of one of the photosensors includes determining a mean triggering probability of said photosensor.

5. The method according to claim 1, wherein the step of determining the triggering probability of one of the photosensors includes determining a dependence of the triggering probability on the number of photons incident on said photosensor.

6. The method according to claim 1, wherein the step of determining the triggering probability of a photosensor includes determining a first triggering probability of said photosensor for a number of photons incident on the photosensor which is below a predetermined triggering threshold and determining, in particular measuring, a second triggering probability of said photosensor for a number of photons incident on the photosensor which is equal to or above the triggering threshold.

7. The method according to claim 1, wherein the step of determining the triggering probability includes determining a temperature dependence of the triggering probability and wherein the likelihoods are additionally calculated based on a measured temperature.

8. The method according to claim 1, wherein the step of determining the triggering probability includes determining a dependence of the triggering probability on the scintillation event rate and wherein the likelihoods are additionally calculated based on a measured scintillation event rate.

9. The method according to claim 1, wherein the step of determining the triggering probability includes determining a dependence of the triggering probability on the number of neighboring photosensors that have been triggered and wherein the likelihoods are additionally calculated based on a measured number of neighboring photosensors that have been triggered.

10. The method according to claim 1, wherein the steps of calculating the likelihood for each of the scintillator element locations and identifying the scintillator element location having the maximum likelihood are iteratively repeated with a modified energy value for each of the iterations.

11. Computer program product for performing the method according to claim 1, comprising instructions which when executed on a processor cause the processor to carry out the steps of:
   determining, for each of the photosensors, a triggering probability indicative of the probability of said photosensor measuring a number of photons that exceeds a predetermined triggering threshold, acquiring, from the photosensors, a photon distribution indicative of the number of photons incident on the individual photosensors, calculating, for each of the scintillator element locations, a likelihood that a scintillation event with a predetermined energy value took place in said scintillator element location based on the measured photon distribution and the triggering probability of each of the photosensors; and identifying the scintillator element location having the maximum likelihood.

12. A radiation particle detector, comprising:

multiple scintillator element locations which are configured to emit a burst of photons responsive to a radiation particle being absorbed at the scintillator element location, a plurality of photosensors optically coupled to said scintillator element locations, and a processor configured to perform the steps of determining, for each of the photosensors, a triggering probability indicative of the probability of said photosensor measuring a number of photons that exceeds a predetermined triggering threshold, acquiring a photon distribution from the photosensors indicative of the number of photons incident on the individual photosensors, calculating, for each of the scintillator element locations, a likelihood that a scintillation event with a predetermined energy value took place in said scintillator element location based on the measured photon distribution and the triggering probability of each of the photosensors; and identifying the scintillator element location having the maximum likelihood.

13. A nuclear imaging system, comprising:

at least one radiation particle detector according to claim 12, a reconstruction unit for reconstructing an image representation based on identified scintillator element locations, and a display for displaying at least a portion of the reconstructed image representation.

14. A nuclear imaging system according to claim 13, further comprising a plurality of radiation particle detectors disposed about an imaging region, wherein the reconstruction unit is configured to perform a positron emission tomography reconstruction technique.

\* \* \* \* \*